US005103172A

United States Patent [19]

Stoll

[11] Patent Number: 5,103,172

[45] Date of Patent: Apr. 7, 1992

[54] PISTON AND CYLINDER DEVICE WITH FIXED CONDUCTIVE GUIDE ON PERIPHERY OF CYLINDER

[75] Inventor: Kurt Stoll, Esslingen, Fed. Rep. of Germany

[73] Assignee: Festo KG, Esslingen, Fed. Rep. of Germany

[21] Appl. No.: 740,444

[22] Filed: Aug. 5, 1991

Related U.S. Application Data

[63] Continuation of Ser. No. 493,922, Mar. 14, 1990, abandoned.

[30] Foreign Application Priority Data

Apr. 8, 1989 [DE] Fed. Rep. of Germany ....... 3911605
Jul. 13, 1989 [DE] Fed. Rep. of Germany ....... 3923063

[51] Int. Cl.[5] ..................... G01N 27/72; G01R 33/00; F01B 25/26; F01B 31/12

[52] U.S. Cl. ............................... 324/226; 324/207.11; 324/207.13; 324/207.22; 324/207.24; 324/262; 92/5 R

[58] Field of Search ...................... 324/207.11, 207.13, 324/207.22, 207.24, 226, 262; 92/5 R; 362/147, 404; 361/428; 91/275, 277

[56] References Cited

U.S. PATENT DOCUMENTS

| | | | |
|---|---|---|---|
| 4,176,586 | 12/1979 | Stoll et al. | 92/5 R |
| 4,814,953 | 3/1989 | Distasio | 362/404 |

FOREIGN PATENT DOCUMENTS

| | | |
|---|---|---|
| 2516495 | 10/1976 | Fed. Rep. of Germany . |
| 3024244 | 1/1981 | Fed. Rep. of Germany . |
| 3130056 | 11/1983 | Fed. Rep. of Germany . |
| 8315785 | 6/1986 | Fed. Rep. of Germany . |
| 8632990 | 4/1987 | Fed. Rep. of Germany . |
| 3644591 | 7/1987 | Fed. Rep. of Germany . |
| 8700899.8 | 1/1988 | Fed. Rep. of Germany . |

*Primary Examiner*—Walter E. Snow
*Attorney, Agent, or Firm*—Flynn, Thiel, Boutell & Tanis

[57] ABSTRACT

A control device for piston and cylinder units comprises a sensor adapted to be operated by a moving member and arranged on a guide device which has at least one electrical track conductor. Via a contacting device the sensor is connected with the electrical track conductors so as to make possible the transmission of sensor signals without leads.

19 Claims, 4 Drawing Sheets

PISTON AND CYLINDER DEVICE WITH FIXED CONDUCTIVE GUIDE ON PERIPHERY OF CYLINDER

This application is a continuation of U.S. Ser. No. 07/493,922, filed Mar. 14, 1990, now abandoned.

FIELD OF THE INVENTION

The invention relates to control device and more particularly but not exclusively to a control device for a piston and cylinder unit, and comprising at least one sensor, as for instance in the form of a reed or inductive switch to be connected with a preferably electrical signal conductor, said sensor being able to be set adjacent to or within the path of motion of a member able to be shifted in relation to it, within a working range and being adapted to be mounted adjustably on a guide device and to be actuated by means of the said movable member, the latter preferably being the piston of the piston and cylinder unit or a member connected therewith, said guide device being adapted to be more especially arranged on the cylinder of the said unit, the direction of shifting of the sensor preferably being the same as the direction of motion of said movable member.

BACKGROUND OF THE INVENTION

Such a control device has been described in a connection with a piston and cylinder unit in the German utility model 7,502,826 (corresponding to U.S. Pat. No. 4,176,586). In this case the guide device took the form of a rail-like holding device, which was secured to the exterior of the cylinder. In the case of the sensors it was a question of reed switches and the piston able to move in the cylinder bore a magnet device able to operate the sensor without making contact therewith, when it moved into the range of response of the latter. In order to vary the time of actuation thereof, the sensors may be positioned on the guide device by displacement to any desired point within a working range.

An arrangement would also be conceivable in which the shifting adjustment of the respective sensor would involve detachment and re-attachment, in which case the guide device may be in the form of one or more simple holding devices.

For the transmission of the signal produced by the operation of a respective sensor prior sensors have been connected with signal conductors in the form of leads adapted to carry an electric current. If the sensors are not carefully handled or if a sensor should come into the path of motion of a moving workpiece, the lead may be torn off and the system will cease to be operational. The replacement of the sensors is an awkward operation since the connection lead has to be replaced as well and there is a danger of confusing the leads on re-assembly. A further relevant point is that the loosely placed leads present an untidy appearance, more especially if the pressure hose leading to the cylinders is loose as well.

SHORT SUMMARY OF THE PRESENT INVENTION

Accordingly one object of the invention is to devise a control device of the initially mentioned type, which is less vulnerable to damage during operation.

A still further aim of the invention is to provide such a system which facilitates the assembly and replacement of the sensors.

Yet another objective of the present invention is to improve the appearance of a piston and cylinder unit system with a sensor and more particularly to provide for a more orderly and straightforward appearance.

In order to achieve these or other objects appearing from the present specification, claims and drawings, the control device comprises at least one electrical track conductor extending in the direction of shifting of the sensor and fixed in relation to the guide device and constituting at least part of the said signal conductor, the sensor being provided with a contact device connected with switching means of the sensor and providing a connection with the electrical track conductor in every position assumed on the guide device within its working range.

Thus at least one electrical track conductor extends along the working range of the respective sensor in order to function for the transmission of signals in place of loose leads. The sensor or, respectively, its switching means such as switching contacts, is connected when the sensor is arranged within the working range on the guide device, via a contacting device with the one or more associated electrical track conductors without the use of leads. It is therefore no longer necessary to provide freely extending or festooned electric leads running to the sensors so that there is no danger of damage to the same either. The electrical track conductors may be arranged to extend directly to the desired position at which the signals produced by response of the respective sensor are processed. It is also possible to arrange the electrical track conductor to extend only as far as a point at which leads in a conventional form, as for example in the form of loose wiring, may be connected without danger of damage. It is thus possible to provide any desired lengths of the working range in the design in accordance with the invention without impairing the functional reliability of the control system. In every case there will be a tidy-looking system which is free of loose leads.

Further developments of the invention are described in the claims.

It is more particularly an advantage if the contact device maintains a permanent contact with the electrical track conductor when the sensor is set or shifted, the contacting means for this purpose preferably having at least one wiper contact. In this case the respective sensor is held in an adjustable manner on the guide device for the shifting motion and the contact device slides along the respective associated electrical track conductor to make uninterrupted contact with it when the change in position takes place.

Preferably the respective electrical track conductor is arranged directly on the guide device and is preferably integrated in it. This facilitates the assembly of the control device at any desired point on the equipment.

In accordance with a convenient feature of the invention the electrical track conductor is connected with a first terminal device, which is able to be detachably connected with at least a first terminal means, via which the sensor signals are able to be conducted. The terminal or connection device and means are in this case preferably components of a plug connector device, in the case of which the terminal means are able to be associated with a male terminal connector. In this case it is possible to instantly make or interrupt the connection between the electrical track conductors and a device, as for instance a signal processing device, connected with the terminal means. The assembly time is substantially reduced.

It is more particularly in conjuction with the employment with piston and cylinder unit that the control device may have a further terminal part adapted to be detachably secured to the cylinder, has ducts therein for power fluid which when connected with the cylinder are in communication with ducts of the cylinder. The terminal or connection part may be a male plug connector so that the connection for the power fluid may be instantly made or interrupted. For the transmission of signals from the sensor it is particularly expedient if first terminal means are provided on the terminal part as well in order to be simultaneously join up or disconnect both the electrical and also the fluid power lines.

The connection of electrical leads, pressure hose and the like is facilitated if a distributor is detachably arranged on the terminal or connection part and which has suitable connection devices for the leads, hose and the like.

The invention will now be described in more detail with reference to the accompanying drawings.

LIST OF THE SEVERAL VIEWS OF THE DRAWINGS

DETAILED DESCRIPTION OF WORKING EMBODIMENTS OF THE INVENTION

The control device in accordance with the invention is more especially applicable in cases in which a signal is to be produced for further processing in accordance with the position of a moving member. The signal may for instance be used directly for reversing the motion of a moving member or, however, for initiating other external switching operations. The use of the invention will be particularly appropriate in conjunction with piston and cylinder units, as for example those indicated in FIGS. 1 through 5, the moving member responsible for actuating of the respective sensor being the piston of the unit or a member connected therewith.

Figure 1:
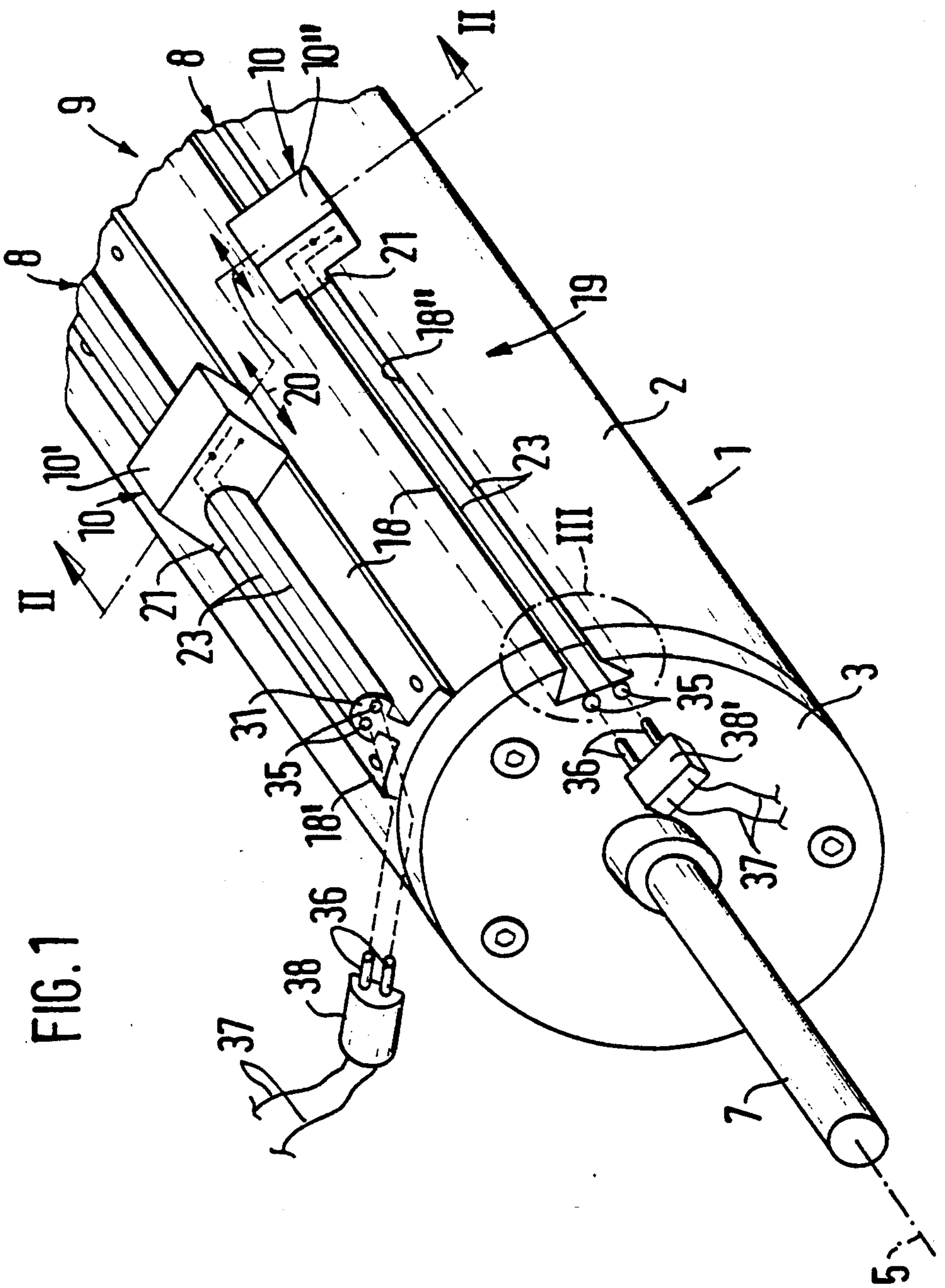
FIG. 1 is a sectional, diagrammatic perspective view of a first design of the control device in accordance with the invention in conjunction with a piston and cylinder unit.

In the case of the preferred, illustrated working embodiments of the invention the piston and cylinder unit will be seen to comprise a cylinder 1 with a cylinder barrel 2, which at its two axial ends is sealed off, for instance by end covers 3. In accordance with FIG. 1 it is possible for the outer configuration of the cylinder end cover 3 to be identical to that of the cylinder barrel 2 and like it to be circular. As will be seen from the working embodiment of FIG. 4, the cylinder end cover 3 has the form of a plate with a rectangular, for instance square form, which is applied to the end of the circularly cylindrical barrel 2. A piston 4 is arranged in the cylinder barrel 2 for axial reciprocating motion and it defines one or two working spaces 6 and 6'. When the piston 4 is provided with a piston rod 7 (as is in fact the case in the present example) such piston rod will extend outwards through the one said cylinder end cover 3, as is indicated in FIG. 1.

The control device 8 associated with the piston and cylinder unit 9 comprises at least one sensor 10. It would also be possible to have a plurality of sensors 10, but in the working examples of the invention there are in each case two sensors 10. The sensors are preferably in the form of so-called reed switches or relays, which have a switching member 14 or whip contact (best shown in FIG. 2) able to be reciprocated in a housing 11 as indicated by the double arrow 12. In the non-activated position the switching member 14 is spaced from a further switching contact 15. If a magnet arrangement 16 is brought into the response or sensitivity range of the sensor, the switching member 14 will be switched as indicated by arrow 12 and will touch the further switching contact 15 to close a circuit briefly. The result will be production of a signal able to be processed.

Figure 2:
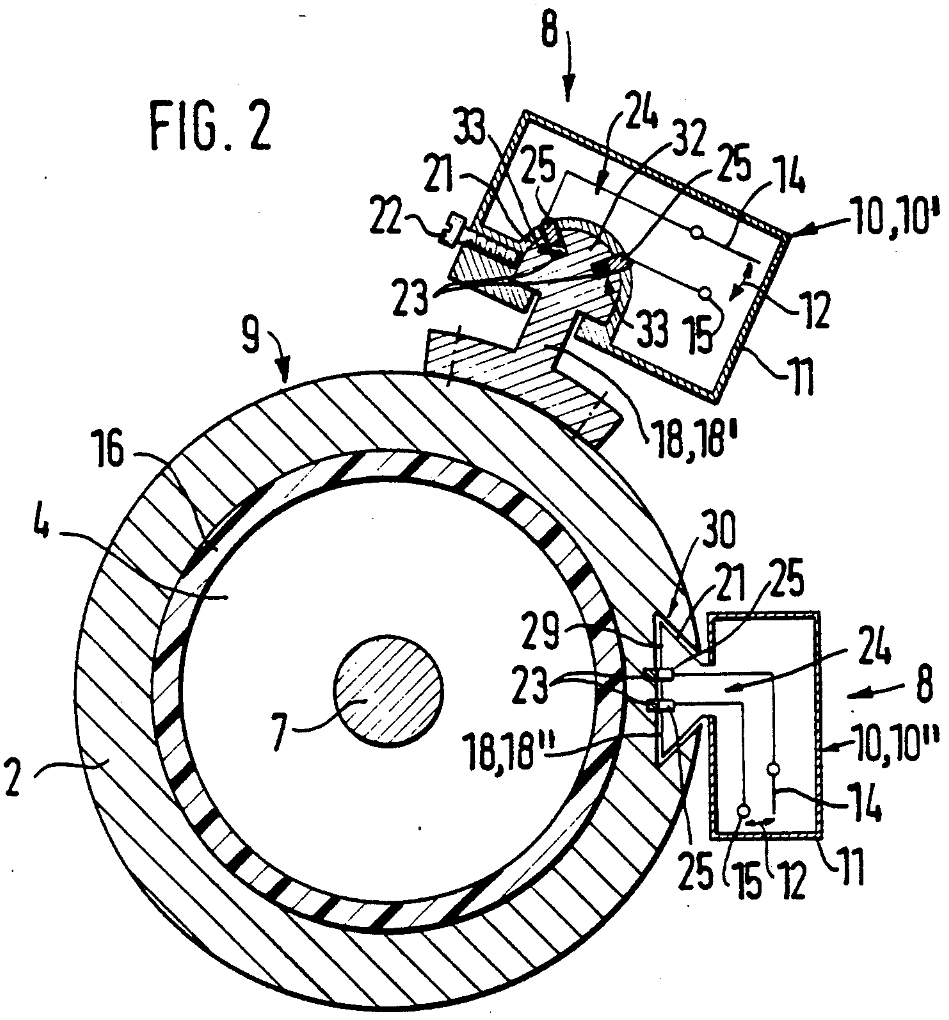
FIG. 2 is a cross section taken through the arrangement of FIG. 1 on the line II—II of this same figure.

Preferably the sensors 10 are arranged on the circumference of the cylinder barrel 2 and the magnet arrangement 16, for example with an annular configuration, is secured to the piston 4 so as to move therewith (see FIG. 2). If the piston 4 is moved as indicated by the double arrow 17 in the axial direction 5, it the magnet arrangement 16 will be moved with it so that the latter arrives in the response range of a sensor, which will be actuated. The response range is as a rule generally reached when the magnet arrangement 16 is approximately radially within the respective sensor 10 with reference to the longitudinal axis of the cylinder.

It is also quite possible to make the entire piston 4 magnetic or however to provide the piston rod 7 with a driving magnet arrangement. In addition it is possible to have any other desired designs of sensors 10 within the framework of the present invention, for instance in the form of proximity sensors, more especially of the inductive type, which are arranged alongside the path of motion of a moving member.

For each sensor 10 a guide device 18 is provided, on which the sensor is held. Each such guide device 18 may bear one or more sensors simultaneously. The embodiment of the invention as illustrated in the FIGS. 1 through 3 has two guide devices 18' and 18'', on each of which only one sensor 10' and, respectively, 10'' is borne, while the guide device 18 of the working embodiment is fitted with two sensors 10. The embodiment of FIG. 1 offers the advantage that the sensors are able to be positioned to overlap in the axial direction, since the guide devices 18 are arranged alongside each other with a spacing in between.

Figure 3:
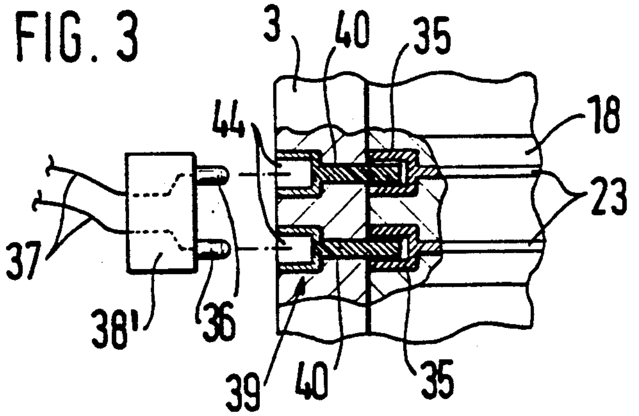
FIG. 3 is view on a larger scale of the part III in FIG. 1 indicated by a chain-line circle therein.

The guide devices 18 are arranged in the vicinity of the outer face, that is to say of the circumference 19 of the cylinder 1 and more particularly of the cylinder barrel 2. The two guide devices 18' and 18'' provided in the case of the embodiment shown in FIGS. 1 through 3 are spaced from each other in the peripheral direction of the cylinder barrel 2. Each of the guide devices 18' and, respectively, 18'' extends in the longitudinal direction of the cylinder and thus parallel to the direction 17 of motion of the piston 4.

The individual sensors 10 are able to be adjusted on the respective guide device 18 in the longitudinal direction thereof within a working range, and the direction 20 of adjustment or shift is the same as the possible direction 17 of motion of the piston 4. The working range extends in the working embodiments generally along the length of the cylinder barrel 2 between the two cylinder end covers 3. As is indicated on the basis of the guide device 18″ in FIG. 2, it is possible for the working range to extend, for instance, even as far as the periphery of a cylinder end cover.

The sensors 10 are able to be adjusted in position in the guide devices 18 by shifting. They are fitted, for instance, by axially sliding them onto the guides devices from one end thereof. In the fitted condition the respective sensor 10 is fixed by a holding part 21 thereof on the respective guide device 18.

For adjustment to set various switching points the sensors 10 may be mounted within the working range at such points in relation to the associated guide device 18. For this purpose the holding parts 21 may be provided with clamping screws 22, although it is also possible to have recourse to other clamping elements. It is also possible to employ sensors that are able to be mounted on the associated guide device in a radial direction so that it is then not necessary for the sensor to be slipped on at one end. Furthermore in accordance with a further embodiment of the invention, which is not illustrated, it is possible for the sensors to be changed over for adjustment as is indicated by the double arrow 20.

The signal produced by the actuation of the respective sensor 10 generally has to be fed to a processing or responding device or the like. These devices may be in the form of valves, actuators, indicating devices, central switching means or the like in accordance with the particular purpose to which the signal is to be put. In the control device in accordance with the invention there are signal conductors for the transmission of the signals, such conductors being constituted, at least in part by one or more electrical track conductors 23. Each sensor 10 has associated with it at least one such electrical track conductor 23 which is arranged in a fixed relationship to the respective guide device 18 and extends essentially in the direction 20 of shift of the respective sensor 10 and thus in the longitudinal direction 5 of the cylinder. As illustrated, the individual electrical track conductors 23 are preferably arranged on the guide device 18 and more especially integrated in it so that they may jointly be mounted together with the guide device and also handled therewith.

It is possible to have electrical track conductors 23 on the guide devices 18 for one or more sensors 10 simultaneously. Dependent on the particular design of the sensor it is possible for it to have one or more (more especially two) electrical track conductors. In the working embodiment in accordance with FIGS. 1 through 3 and 5 there are two electrical track conductors 23 on each guide device, which extend parallel to each other, that is to say with a spacing between them, same being provided for one respective sensor 10. In the embodiment illustrated in FIG. 4 the guide device 18 is provided with four electrical track conductors 23, two of the electrical track conductors being used as signal conductors for one of the two sensors 10.

The electrical connection with the switching means 14 and, respectively, switching contacts 15 of the individual sensors 10 is respectively via a contact device 24 of the sensor 10 (as is best shown in FIG. 2). This contact device comprises one contact for each electrical track conductor to be connected, such contact being more especially in the form of a wiper contact 25, which is fixed in relation to the sensor. Accordingly the contact devices 24 of the working embodiments of the invention are each fitted with two wiper contacts 25, which in the engaged state of the sensor engaging the guide device 18, make contact with the respective electrical track conductor 23. This touching contact is maintained whatever the respective sensor position, and even when the sensor is in the process of being shifted. The wiper contacts 25 which in the sensor are joined with the switching means 14 and, respectively, the switching contacts 15, are urged against the respective electrical track conductor 23 and slide along it when shifting take place. It is an advantage here if the wiper contacts 25 are biased elastically and more especially resiliently against the electrical track conductors 23.

This ensures that each sensor 10 is connected with the associated electrical track conductor via the contacting device 24 in a position assumed on the guide device 18 within the operating range. The sensors may thus be designed without leads, this precluding damage, facilitating handling and improving the look of the equipment.

It is an advantage if, as in the working embodiments of the invention, the contacting devices 24 are respectively arranged on the holding part 21 of the sensors 10 so that they or, respectively, their wiper contacts 25 are automatically connected with the associated electrical track conductor 23 on mounting the sensor on the guide device 18. To this end the case of the sensor 10″ of the working embodiment of FIGS. 1 through 3 and in the case of the sensors 10 of the working embodiment of FIG. 4 the contact device 24 is mounted on the lower side of a holding foot 29 forming the holing part 21, such foot 29 being inserted in a longitudinally adjustable manner in a groove 30 on the outer periphery 19 of the cylinder barrel, such groove forming the guiding device 18. The groove or depression 30 and the holding foot 29 are adapted to each other in cross section, and configured for instance in the form of components of a dovetail guide device. The electrical track conductors 23 mores specially in the form of rail line conductors, are here adjacent to the bottom of the groove or depression 30 and preferably set in the latter.

On the other hand the guide device 18′ is provided with a rail-like raised part 31 or hump extending in the direction 20 of shift and carrying the electrical track conductors so that it may be termed a current conductor rail. The holding part 21 fits around a guide part 32 of the guide device 18′, in which the electrical track conductors 23 are best set or let into in order to preclude unintended contact therewith which might lead to short circuiting. Accordingly the wiper contacts 25 extend out of the holding part 21 and fit into the depressions or grooves of the guide part 32 containing the electrical track conductors 23.

In order to provide for connection of the electrical track conductor 23 with the devices processing the signals produced it is expedient to provide first terminal or connection means 35 on the electrical track conductors 23. They are preferably at the axial end parts of the electrical track conductor 23. They may have first terminal means 36 detachably connected with them with the production of an electrical contact, same being for their part connected to, or adapted to be connected to, conductors 37, such as leads in order to conduct the sensor signals.

It is convenient to design the first terminal devices 35 and the terminal means 36 in the form of components of plug and socket connection systems in order to enable the signal connection path to be made or interrupted instantly. In this respect there are a number of different possible designs. To take an example, it possible for the first terminal means 36 to be parts of a terminal male plug connector 38 (see FIG. 1) and for the first terminal devices 35 arranged for instance at the end of the guide device 18′, to be detachably plugged together. As may be seen from FIG. 3 in conjunction with FIG. 1 it is possible also to have a female connector 39 placed between a first respective terminal device 35 and the first terminal means 36 provided for instance on the a terminal male connector 38′. In this case it is integrated in the cylinder end cover 3 and possesses current conducting coupling or socket elements 40, which on the cylinder barrel side are conductingly coupled with the first terminal devices 35, while on the other hand they have second terminal devices 44 corresponding to the first terminal devices 35, the terminal male connector 38′ being able to be joined to the devices 44.

Figure 4:
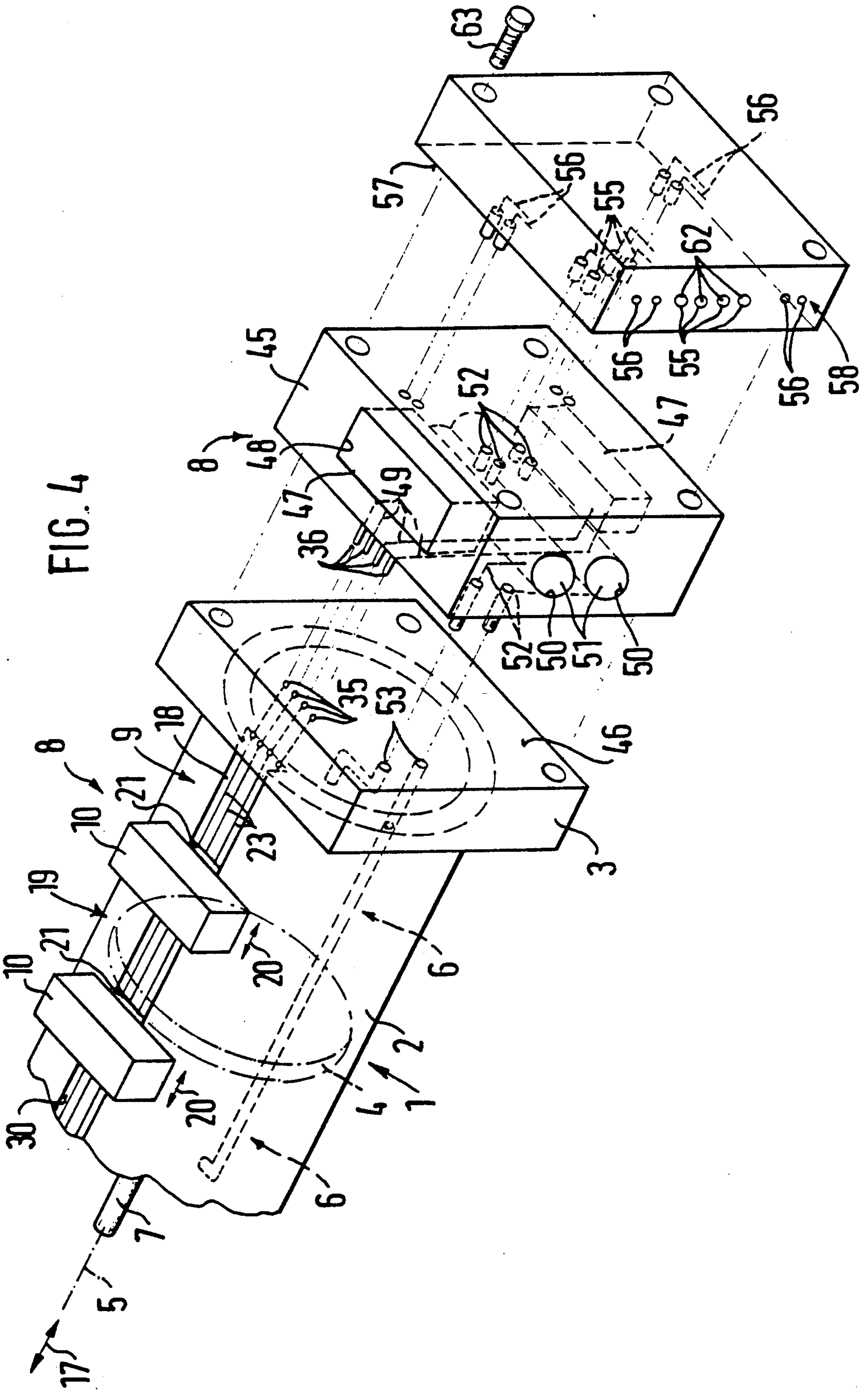
FIG. 4 is a diagrammatic and exploded view of a further embodiment of the piston and cylinder unit in accordance with the invention showing only part of the unit.

In the case of the working embodiment of FIG. 4 the first terminal means 36 are components of a block- or plate-like terminal part 45, which may be mounted in a detachable manner on the end face, remote from the cylinder barrel 2, of a one cylinder end cover 3. In the mounted state the first terminal means 36 are in the present case joined to first terminal devices 35, more particularly as part of a plug and socket joint system, such devices 35 being provided on the adjacent end face 46 of the cylinder end cover 3 and connected with the electrical track conductor 23. The terminal part 45 thus in this case as well has a plug or male joint member function. Furthermore it preferably constitutes a carrier for at least one magnet device 47. In the working embodiment there are two such magnet devices 47 which are let into opposite terminal part sides in complementary depressions 48. By way of conductors 49 marked in chained lines the first terminal means 36 are connected with the magnet devices 47. Accordingly each sensor 10 is connected with one magnet device 47 electrically.

In addition the terminal part 45 comprises two further depression 50, in each of which a valve devices 51 (which is only indicated schematically like the magnet device) is set. Each valve device 51 is connected with one of the magnet devices 47 in a manner which is not specially indicated in the drawings.

The valve devices 51 are placed on fluid power ducts 52, which extend through the terminal part 45 and/or are formed in the interior of the terminal part. When the terminal part 45 is mounted on the cylinder end cover 3, some of the fluid power ducts 52 are in communication with ducts of the cylinder 53, which extend through the cylinder end cover 3 and/or the wall of the cylinder barrel 2 and open into the working spaces 6 and 6′ of the cylinder 1. The magnet devices 47 preferably constitute actuating devices of the respectively connected valve device. By mounting the terminal part 45 on the cylinder end cover 3 the fluid power ducts 52 are thus automatically connected with the cylinder ducts 53 and the conductors are connected with the electrical track conductors 23.

If needed it is also possible to mount a distributor or header 57 on the terminal part 45, it preferably being so arranged that the terminal part assumes a position between the cylinder end cover 3 and the header 57. The header 57 has distribution ducts 55 indicated only in chained lines, within it, and furthermoreelectrical signal conducting means 56, which for instance are in the form of leads. All these energy conductors open at one side to face the terminal part 45 and at another side at a connection or terminal side 58. When the header 57 is mounted on the terminal part 45, some of the fluid power ducts 52 will communicate with the distribution ducts 55 and the signal conducting means 56 will communicate with the magnet devices 47. The ports on the terminal side 58 are preferably provided with connecting means 62, for instance in the form of bores adapted to have male plug parts inserted into them, or with female threads so that leads, hoses and similar energy transmitting means may be connected directly or for instance using a multiple plug and socket connector. The header 57 is also preferably in the form of a plate so that together with the cylinder end cover 3 and the terminal part 45 it will form a block-like unit in the assembled state (assembly preferably being performed using fastening screws 63).

In the case of a preferred manner of operation of this arrangement the valve devices 51 may be supplied with fluid under pressure and/or vented via ducts 55 and 52. Dependent on the specific switching state of the valve devices 51 it is accordingly possible to supply or vent the cylinder ducts 53 which lead to the working spaces. The respective switching state of the valve devices 51 is affected by the associated magnet devices 47, which may be parts of a pilot valve. The state of the magnet devices 47 will depend on the switching state of the sensors 10 connected via the conductors 49 and which respond to the motion of the piston 4.

The invention thus makes it possible to have current conductor rails screwed onto the cylinder barrel or integrated therewith and onto which the sensors may be slipped without the use of leads. In order to still further reduce the danger of damage both to leads and also to hoses, it is possible to have further plugging connectors via which electrical signals may be transmitted and which provide for the connection of fluid power. The male connectors or the terminal parts for the electrical signals and the supply of power fluid are preferably on the same cylinder side, and more especially at the axial end thereof. The plug connector means make possible instant disconnection of the energy conductors, that is to say of the electrical conductors and the pressurized fluid conductors, which will more especially be in the form of compressed air, this feature reducing expensive assembly time.

It will be clear that another number of valve devices may be arranged in the terminal part 45. The working embodiment shown herein does however offer the advantage that two three way valves may be provided, this making possible greater flexibility as regards the connections between individual working spaces 6 and 6′. Another relevant point is that the form of the guide parts 32 and of the depressions 30 may readily be designed in some other way than the one indicated above.

Figure 5:
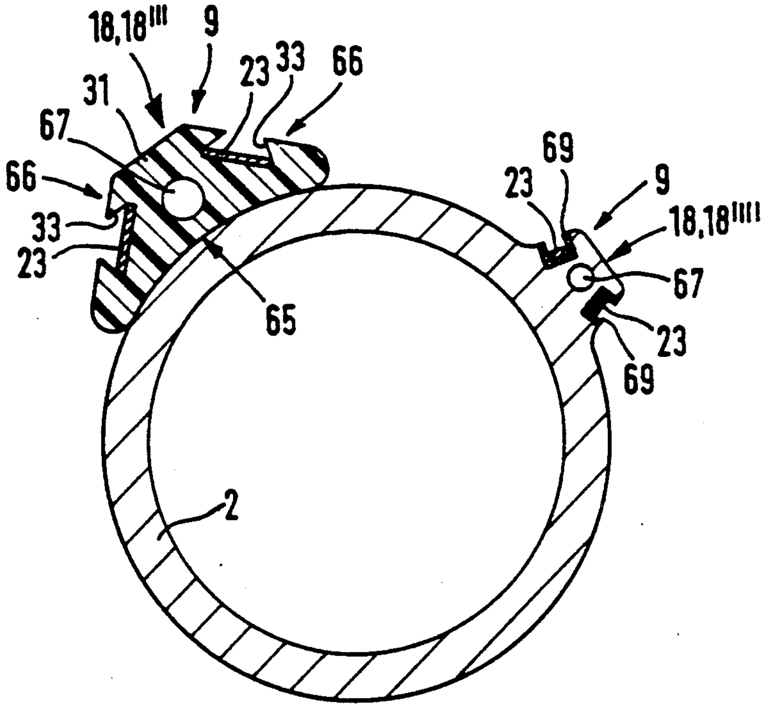
FIG. 5 shows a further possible geometry of the control device.

In the working embodiment in accordance with FIG. 5 corresponding components are provided with identical references. This figure omits sensors, the piston and the piston rod and is in the form of a section through the cylinder barrel 2, on whose periphery two different embodiments of guide devices 18, 18‴ and 18⁗ are arranged. They may be used alone or in combination with any other guide devices.

The guide device 18⁗ is integrated in the cylinder barrel, that is to say, in the present case, made in one piece with it. It has a flange extending in the longitudinal direction of the barrel. The two sides of the flange turned in the peripheral direction may, as in fact illustrated, run towards each other radially outwards so that the flange tapers radially outwards in cross section. This facilitates the mounting of a sensor or other component thereon, an electrical track conductor 23 is mounted in each side of the flange so that the resulting arranged is similar to that of the guide device 18'.

The other guide device 18''' is in the form of a component which is separate from the cylinder barrel 2 and the cylinder 1 and is preferably permanently adhesively bonded to the periphery of the cylinder barrel 2. The base face 65 thereof, which faces the outer surface of the barrel, is thus adapted to the configuration of the barrel and in the case of a circular cylinder will be suitably curved. The result is then a large bonding interface. This embodiment leads to the advantage that almost any type of cylinder may be upgraded in accordance with the invention. However in order to provide for flexibility the attachment may be nonpermanent, as is for instance the case with the guide device 18' in FIGS. 1 and 2. This device is in fact secured by screws marked in broken lines in FIG. 2, such screws acting between the holding foot 29 and the cylinder barrel or the cylinder end cover.

Owing to the separate design of the guide devices it is also possible to make a wider selection of material for the guide devices. This makes it more readily possible to provide an arrangement in, which the electrical track conductors are insulated from the associated guide device. At least in the parts in which there is contact with a electrical track conductor to make the guide device of an electrically nonconducting material or to provide same with such a material. It is preferred to utilize a synthetic resin or plastic. It is simplest to adopt the design used in FIG. 5, in which the entire guide device 18''' consists of plastic material.

The guide device 18''' practically forms a current conductor rail consisting of plastic or resin and bearing the electrical track conductors 23 in lateral depressions 33. In this case as well it is expedient if the depressions 33 are made in facing sides 66 of the rail-like guide device 18''' turned in the peripheral direction. Because the cross section of the rail preferably becomes narrower in a radially outer direction, the sides 66 are set obliquely.

FIG. 5 discloses a further advantageous form of the invention in accordance with which a respective guide device 18 has a hole 67 extending along at least part of its length. It may be provided merely to save weight or may, preferably, serve as a supply duct. Such a duct may be used for power fluids such as compressed air, liquids or, in the case of the provision of a lead or the like, for electric current etc. It is then no longer necessary to provide any outer hose or lead arrangements. It is preferably a question of through ducts which are directly produced with the guide device.

As a material for the electrically conducting electrical track conductors it is possible to use metal, more particularly copper. If the guide device bearing the respective electrical track conductors consist of conducting metal it is convenient to place an intermediate layer between them and the respective electrical track conductors, as is in fact illustrated in FIG. 5 by way of example (at 69).

I claim:

1. A piston and cylinder device, comprising:

an elongated hollow enclosed cylinder having an exposed outer surface;

a piston positioned within said cylinder and capable of reciprocating movement along the elongation direction thereof based on fluid medium input into said cylinder;

an elongated guide element provided on the outer surface of said cylinder and extending parallel to the elongation direction thereof, said elongated guide element including at least one fixedly positioned electrical track conductor thereon extending in the elongation direction;

sensor means and adjustment means for facilitating an adjustable and fixed positioning of said sensor means on said guide element and along the elongation direction thereof, said sensor means including at least one slide contact means for engaging said electrical track conductor in every adjusted position thereof on said guide element, said sensor means including means being activated in response to movements of said piston to a position adjacent the adjusted position thereof;

a detachably connected terminal part mounted on said cylinder adjacent an axial end of said cylinder, said terminal part comprising fluid pressure ducts therein which, in the condition in which said terminal part is connected with said cylinder, are in direct fluid communication with fluid ducts in said cylinder, said terminal part additionally comprising at least one fluid valve device connected in fluid communication with said fluid ducts in said cylinder, said terminal part additionally comprising at least one actuating device for said at least one fluid valve device, said actuating device, in the condition in which said terminal part is connected with said cylinder, being electrically connected to said at least one electrical track connector by means of mating plug connector means provided on said cylinder and on said terminal part, said plug connector means of said cylinder being electrically connected to said at least one electrical track connector, and said plug connector means of said terminal part being electrically connected by way of electrical conductor means to said at least one actuating device, at least one of said at least one actuating device and said at least one fluid valve device being housing in recesses, respectively, of said terminal part.

2. The piston and cylinder device as claimed in claim 1, wherein said at least one actuating device comprises a magnet device.

3. The piston and cylinder device as claimed in claim 2, wherein said at least one actuating device is a pilot valve, said magnet device being a part of said pilot valve.

4. The piston and cylinder device as claimed in claim 1, wherein a header is detachably arranged on said terminal part and comprises at least one of fluid distributing duct and electrical conductor means, wherein, in the condition in which said header is connected with said terminal part, said fluid distributing ducts are fluidically connected to said at least one fluid valve device in said terminal part and said electrical conductor means are electrically connected to said at least one actuating device in said terminal part, and wherein at least one of said fluid distributing ducts and said electrical conductor means of said header are connected with at least one of said fluidical and electrical connecting devices on the outer surface of said header for connection with at least one of means for supply and removal of at least one of electrical or fluidical energy.

5. The piston and cylinder unit as claimed in claim 4, wherein said at least one of fluidical and electrical connecting devices are arranged on a common terminal side.

6. The piston and cylinder unit as claimed in claim 1, wherein the terminal part carries two actuating devices and two fluid valve devices.

7. The piston and cylinder unit as claimed in claim 1, wherein at least one of said at least one fluid valve devices is a three way valve.

8. The piston and cylinder device as claimed in claim 1, wherein said slide contact means maintains permanent contact with said electrical track conductor on shift of said sensor means along said guide element and said electrical track conductor.

9. The piston and cylinder device as claimed in claim 1, wherein for each sensor means provided on said guide element, at least one additional electrical track conductor is provided, said conductors extending parallel to each other.

10. The piston and cylinder device as claimed in claim 1, wherein said electrical track conductor is arranged directly on said guide element.

11. The piston and cylinder device as claimed in claim 1, wherein a holding means is provided on said sensor means for locking said sensor means to said guide element, said slide contact means being arranged in the vicinity of said holding means so that on attachment of said sensor means to said guide element, said slide contact means is automatically connected with the associated electrical track conductor.

12. The piston and cylinder device as claimed in claim 1, wherein said electrical track conductor is in the form of a rail-like current conductor.

13. The piston and cylinder device as claimed in claim 1, wherein said guide element is at least one of an upstanding a rail and a groove-like depression.

14. The piston and cylinder device as claimed in claim 1, wherein a plurality of guide elements for separate respective sensor means is provided.

15. The piston and cylinder device as claimed in claim 1, wherein said guide element is at least one of integral with said cylinder and separate from said cylinder but includes means securing it thereto.

16. The piston and cylinder device as claimed in claim 1, wherein said electrical track conductors are electrically insulted from guide element.

17. The piston and cylinder device as claimed in claim 1, wherein said guide element is made entirely of a moldable synthetic resin.

18. The piston and cylinder device as claimed in claim 1, wherein said guide element has at least one hole extending along at least part of its length.

19. The piston and cylinder device as claimed in claim 1, wherein said sensor means is an electrical switching device.

* * * * *